(12) United States Patent
Yamada et al.

(10) Patent No.: US 11,336,234 B2
(45) Date of Patent: May 17, 2022

(54) POWER AMPLIFIER CIRCUIT

(71) Applicant: Murata Manufacturing Co., Ltd., Kyoto (JP)

(72) Inventors: Takashi Yamada, Kyoto (JP); Yuuri Honda, Kyoto (JP); Satoshi Tanaka, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 76 days.

(21) Appl. No.: 16/829,776

(22) Filed: Mar. 25, 2020

(65) Prior Publication Data

US 2020/0228067 A1   Jul. 16, 2020

Related U.S. Application Data

(63) Continuation of application No. 16/112,998, filed on Aug. 27, 2018, now Pat. No. 10,637,409.

(30) Foreign Application Priority Data

Aug. 28, 2017   (JP) .............................. JP2017-163096

(51) Int. Cl.
*H03F 3/191* (2006.01)
*H03F 1/32* (2006.01)
*H03F 3/19* (2006.01)
*H03F 3/21* (2006.01)
(Continued)

(52) U.S. Cl.
CPC .............. *H03F 1/32* (2013.01); *H03F 1/565* (2013.01); *H03F 3/19* (2013.01); *H03F 3/191* (2013.01); *H03F 3/21* (2013.01); *H03F 3/245* (2013.01); *H03F 2200/111* (2013.01); *H03F 2200/171* (2013.01); *H03F 2200/222* (2013.01); *H03F 2200/318* (2013.01); *H03F 2200/387* (2013.01); *H03F 2200/411* (2013.01); *H03F 2200/451* (2013.01); *H03F 2201/3215* (2013.01)

(58) Field of Classification Search
CPC ............. H03F 1/56; H03F 3/191; H03F 3/193
USPC ........................................ 330/302, 306, 307
See application file for complete search history.

(56) References Cited

U.S. PATENT DOCUMENTS

| 5,300,895 A | 4/1994 | Jones |
| 6,236,274 B1 * | 5/2001 | Liu .......................... H03F 3/217 330/302 |
| 2003/0015767 A1 | 1/2003 | Emrick et al. |

(Continued)

FOREIGN PATENT DOCUMENTS

CN   103718469 A   4/2014

*Primary Examiner* — Khanh V Nguyen
(74) *Attorney, Agent, or Firm* — Pearne & Gordon LLP

(57) ABSTRACT

A power amplifier circuit includes a power amplifier that amplifies an input signal and outputs the amplified signal from an output terminal thereof, a first filter circuit that has a frequency characteristic that attenuates an Nth-order harmonic of the amplified signal, N that is an integer greater than or equal to 2, and a second filter circuit that has a frequency characteristic that attenuates the Nth-order harmonic of the amplified signal. The first filter circuit includes a first capacitor and a first inductor. The first capacitor and the first inductor are connected in series between the output terminal and ground. The second filter circuit includes a second capacitor and a second inductor. The second capacitor and the second inductor are connected in series between the output terminal and ground.

17 Claims, 13 Drawing Sheets

(51) Int. Cl.
 *H03F 1/56* (2006.01)
 *H03F 3/24* (2006.01)

(56) References Cited

U.S. PATENT DOCUMENTS

| | | | |
|---|---|---|---|
| 2007/0024374 A1* | 2/2007 | Blair | H03F 1/56 330/302 |
| 2013/0029619 A1 | 1/2013 | Zhang et al. | |
| 2014/0145898 A1 | 5/2014 | Tokuda | |
| 2016/0013758 A1 | 1/2016 | Cao et al. | |
| 2016/0380603 A1 | 12/2016 | Zhang et al. | |

* cited by examiner

POWER AMPLIFIER CIRCUIT

This is a continuation of U.S. patent application Ser. No. 16/112,998 filed on Aug. 27, 2018 which claims priority from Japanese Patent Application No. 2017-163096 filed on Aug. 28, 2017. The contents of these applications are incorporated herein by reference in their entireties.

BACKGROUND

The present disclosure relates to a power amplifier circuit. Mobile communication devices such as cellular phones typically include a power amplifier circuit having transistors. Such a power amplifier circuit is known to have a good linearity of a transmission signal by attenuating harmonic components included in an amplified transmission signal.

For instance, U.S. Patent Application Publication No. 2013/0029619 discloses a configuration in which a plurality of harmonic termination circuits for short-circuiting harmonic components such as the second-order, third-order, and fourth-order harmonic components of a transmission signal to ground are disposed on the output side of an amplifier.

One specific example of such a harmonic termination circuit is a filter circuit having a frequency characteristic that achieves low impedance at the frequency of a harmonic to be attenuated. In recent years, due to increased transmission capacities of cellular phones and the like, for example, as seen in carrier aggregation (CA) technology, the number of frequency bands to be used has been being increased. Thus, the frequency ranges of harmonics to be attenuated also become wider. In the configuration disclosed in U.S. Patent Application Publication No. 2013/0029619, the bandwidths of the harmonics to be attenuated can become insufficient.

BRIEF SUMMARY

Accordingly, the present disclosure provides a power amplifier circuit capable of harmonic attenuation over a wide range.

According to embodiments of the present disclosure, a power amplifier circuit includes a power amplifier that amplifies an input signal and outputs the amplified signal from an output terminal thereof, a first filter circuit having a frequency characteristic that attenuates an Nth-order harmonic of the amplified signal, N being an integer greater than or equal to 2, and a second filter circuit having a frequency characteristic that attenuates the Nth-order harmonic of the amplified signal. The first filter circuit includes a first capacitor and a first inductor, which are connected in series between the output terminal and ground. The second filter circuit includes a second capacitor and a second inductor, which are connected in series between the output terminal and ground.

According to embodiments of the present disclosure, it may be possible to provide a power amplifier circuit capable of harmonic attenuation over a wide range.

Other features, elements, characteristics and advantages of the present disclosure will become more apparent from the following detailed description of embodiments of the present disclosure with reference to the attached drawings.

DETAILED DESCRIPTION

The following describes embodiments of the present disclosure in detail with reference to the drawings. The same or substantially the same elements are assigned the same numerals and will not be described repeatedly.

Figure 1:
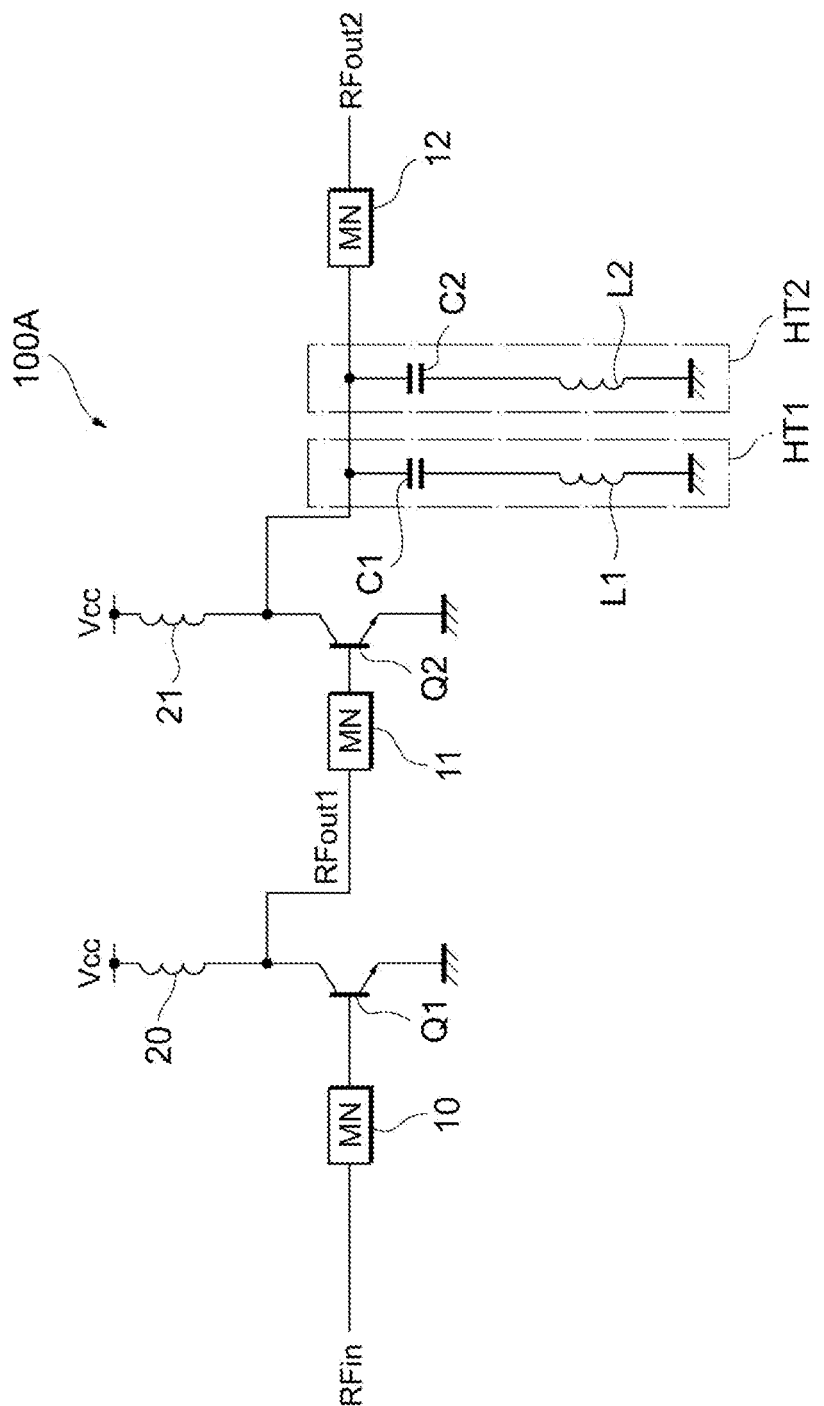
FIG. 1 is a circuit diagram of a power amplifier circuit according to a first embodiment of the present disclosure.

FIG. 1 is a circuit diagram of a power amplifier circuit 100A according to a first embodiment of the present disclosure. The power amplifier circuit 100A illustrated in FIG. 1 is a circuit that amplifies an input signal, which is a radio frequency (RF) signal, and that outputs an amplified signal. For example, the power amplifier circuit 100A amplifies a transmission signal in a plurality of frequency bands. In the following description, the power amplifier circuit 100A is configured to amplify a transmission signal in the low-band frequency bands of the third-generation mobile communication system (3G) (e.g., band 5, band 6, band 8, bands 12 to 14, bands 17 to 20, bands 26 to 28, band 44, band 68, etc.). Among the low-band frequency bands, the lowest frequency band is band 12 (transmit band: 699 MHz to 716 MHz) and the highest frequency band is band 8 (transmit band: 880 MHz to 915 MHz). Thus, the lower limit of the low-band transmission frequencies is equal to the lower limit of band 12 (i.e., 699 MHz) and the upper limit of the low-band transmission frequencies is equal to the upper limit of band 8 (i.e., 915 MHz). Note that the frequency band of a transmission signal to be amplified by the power amplifier circuit 100A is not limited to the low band and may be any other frequency band such as the very low band, the middle band, the high band, or the ultra-high band. Further, the communication standard of a transmission signal is not limited to 3G and may be any other communication standard such as the second-generation mobile communication system (2G), the fourth-generation mobile communication system (4G), or the fifth-generation mobile communication system (5G).

The power amplifier circuit 100A illustrated in FIG. 1 includes, for example, transistors Q1 and Q2, matching networks (MNs) 10 to 12, filter circuits HT1 and HT2, and inductors 20 and 21.

The transistors Q1 and Q2 amplify an RF signal. In this embodiment, the transistors Q1 and Q2 are each a bipolar transistor such as a heterojunction bipolar transistor (HBT). Any other transistor such as a field-effect transistor (a metal-oxide-semiconductor field-effect transistor (MOS-FET)) may be used.

The transistor Q1 is included in a power amplifier in the initial stage (drive stage), and the transistor Q2 is included in a power amplifier in the subsequent stage (power stage). More specifically, the transistor Q1 has a base to which an input signal RFin is supplied via the matching network 10, a collector to which a power supply voltage Vcc is supplied via the inductor 20, and an emitter coupled to ground. The transistor Q1 amplifies the input signal RFin and outputs an amplified signal RFout1 from the collector thereof. The transistor Q2 has a base to which the amplified signal RFout1 is supplied via the matching network 11, a collector to which the power supply voltage Vcc is supplied via the inductor 21, and an emitter coupled to ground. The transistor Q2 further amplifies the amplified signal RFout1 and outputs an amplified signal RFout2 from the collector (output terminal) thereof. Although not illustrated in FIG. 1, a bias circuit supplies a bias current or voltage to the respective bases of the transistors Q1 and Q2. While this embodiment provides an example in which the number of stages of power amplifiers is two, the number of stages of amplifiers is not limited to two and may be one or three or more.

The matching networks 10 to 12 are disposed such that the matching network 10 is located before the transistor Q1, the matching network 11 is located between the transistors Q1 and Q2, and the matching network 12 is located after the transistor Q2. Each of the matching networks 10 to 12 is constructed using, for example, a capacitor and an inductor and is configured to match impedances between circuits.

The inductors 20 and 21 are choke inductors for suppressing leakage of the RF signal to the power supply side. Each of the inductors 20 and 21 is illustrated using a symbol indicative of an inductance element, for convenience of description. However, each of the inductors 20 and 21 may be constituted by any other element having an inductance component. Examples of the other element having an inductance component include a bond wire formed using wire-bonding. This also applies to inductors L1 and L2 described below.

The filter circuits HT1 (first filter circuit) and HT2 (second filter circuit) are each a circuit having a frequency characteristic that attenuates a harmonic component included in the amplified signal RFout2 output from the collector of the transistor Q2. More specifically, the filter circuit HT1 includes a capacitor C1 (first capacitor) and an inductor L1 (first inductor), which are connected in series between the output terminal of the transistor Q2 and ground. Likewise, the filter circuit HT2 includes a capacitor C2 (second capacitor) and an inductor L2 (second inductor), which are connected in series between the output terminal of the transistor Q2 and ground.

The capacitor C1 has an end connected to the collector of the transistor Q2 and another end coupled to ground via the inductor L1. The inductor L1 has an end connected to the other end of the capacitor C1 and another end coupled to ground. Therefore, the filter circuit HT1 serves as a series resonant circuit having a resonant frequency $f_{01}(=1/2\pi\sqrt{LC})$ (in Hz), which is determined by a capacitance value C of the capacitor C1 and a self-inductance value L of the inductor L1. Thus, constants for the capacitor C1 and the inductor L1 are determined such that the resonant frequency $f_{01}$ of the filter circuit HT1 is equal to the frequency of the Nth-order harmonic of the amplified signal RFout2 (where N is an integer greater than or equal to 2), thereby allowing the filter circuit HT1 to function as a harmonic termination circuit for short-circuiting the Nth-order harmonic component to ground. The filter circuit HT2 is similar to the filter circuit HT1 and will not be described in detail here.

The filter circuits HT1 and HT2, each of which is configured to attenuate the Nth-order (e.g., the second-order) harmonic component, may have exactly the same frequency characteristics or may have different frequency characteristics. The following describes this point in detail with reference to various example configurations (example configurations A to C). In the following description, the harmonic to be attenuated by the filter circuits HT1 and HT2 is the second-order harmonic, by way of example. As described above, since the low-band transmission frequency range is 699 MHz to 915 MHz, the second-order harmonic frequency range is 1.398 GHz to 1.830 GHz.

Example configuration A is a configuration in which the capacitance values of the capacitor C1 and the capacitor C2 are equal and the self-inductance values of the inductor L1 and the inductor L2 are also equal. That is, in the example configuration A, the frequency characteristics of the filter circuit HT1 and the frequency characteristics of the filter circuits HT2 are the same and the resonant frequencies thereof are thus equal. The configuration including the two filter circuits HT1 and HT2 whose frequency characteristics are equal can attenuate the second-order harmonic over a wider range than a configuration including only one similar filter circuit. In addition, since the two filter circuits HT1 and HT2 are connected in parallel, the resistance component caused by the inductors L1 and L2 is substantially halved. Thus, the impedance of filter circuits at the second-order harmonic can move toward the short-circuit side, compared with a configuration including only one similar filter circuit.

Example configuration B is a configuration in which the capacitance value of the capacitor C1 is smaller than the capacitance value of the capacitor C2, the self-inductance value of the inductor L1 is larger than the self-inductance value of the inductor L2, and the resonant frequencies of the filter circuits HT1 and HT2 are equal. In the example configuration B, since the self-inductance value of the inductor L1 is larger than the self-inductance value of the inductor L2, the Q-value of the filter circuit HT1 is higher than the Q-value of the filter circuit HT2. For example, when the example configuration A includes two filter circuits having comparatively high Q-values, the bandwidth of the harmonic to be attenuated can be insufficient. For example, when the example configuration A includes two filter circuits having comparatively low Q-values, harmonic attenuation over a wide range is achievable; however, the attenuation of the fundamental frequency may also be increased. In contrast, the example configuration B, which includes the filter circuit HT1 having a comparatively high Q-value and the filter circuit HT2 having a comparatively low Q-value, can suppress or reduce the loss of the fundamental frequency while performing harmonic attenuation over a wide range.

Figure 2:
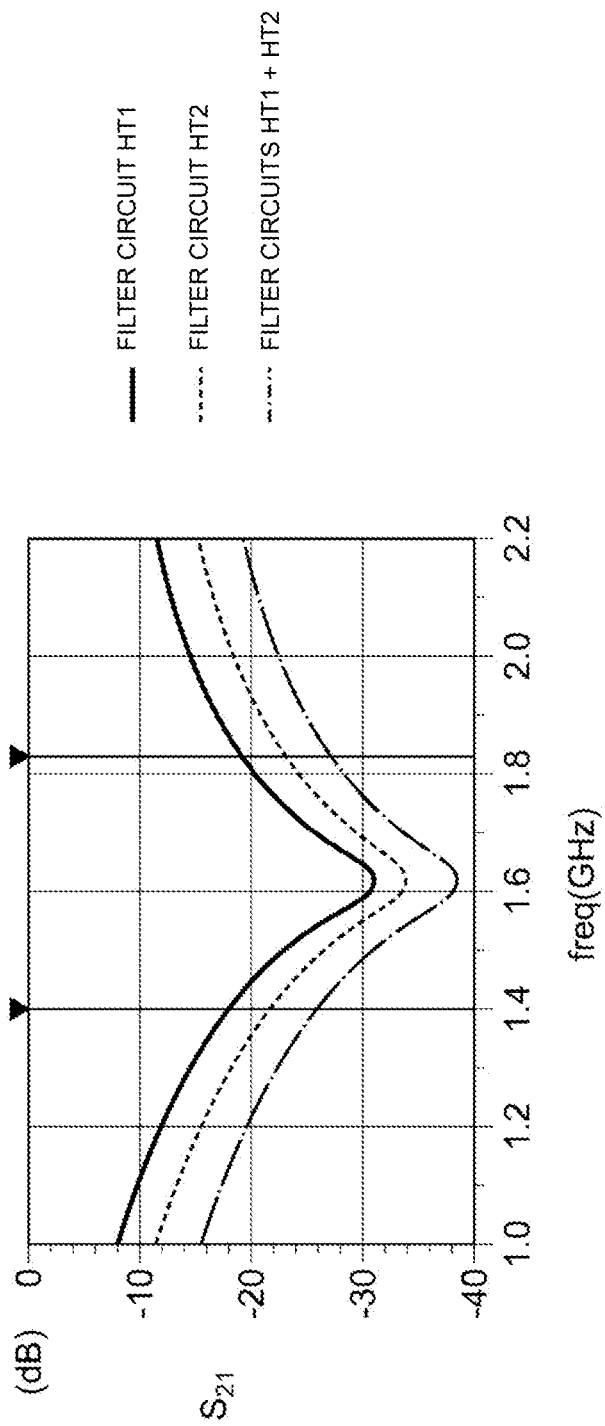
FIG. 2 is a diagram illustrating simulation results of a frequency characteristic of filter circuits in example configuration B.

FIG. 2 is a diagram illustrating simulation results of a frequency characteristic of the filter circuits HT1 and HT2 in the example configuration B. Specifically, FIG. 2 illustrates simulation results of the scattering parameter (S-parameter) $S_{21}$ of the output of the transistor Q2 in a configuration including only the filter circuit HT1, a configuration including only the filter circuit HT2, and a configuration including both the filter circuits HT1 and HT2. In the graph illustrated in FIG. 2, the vertical axis represents the S-parameter $S_{21}$ (in dB), and the horizontal axis represents frequency (in GHz). In the graph, the filter circuits HT1 and HT2 are designed to have a resonant frequency equal to about a center frequency in the second-order harmonic frequency band (1.398 GHz to 1.830 GHz) to be attenuated.

As illustrated in FIG. 2, the filter circuit HT1 has a frequency characteristic such that the Q-value is high, compared with the frequency characteristic of the filter circuit HT2. In contrast, the filter circuit HT2 has a frequency characteristic such that the frequency range is wide, compared with the frequency characteristic of the filter circuit HT1. This is because the self-inductance value of the inductor L1 is larger than the self-inductance value of the inductor L2. This indicates that a combination of the filter circuits HT1 and HT2 whose characteristics are different achieves harmonic attenuation over a wide range.

Example configuration C is a configuration in which the resonant frequency of the filter circuit HT1 and the resonant frequency of the filter circuit HT2 are shifted with respect to each other by adjusting the capacitance values of the capacitors C1 and C2 and the self-inductance values of the inductors L1 and L2. A configuration including a plurality of filter circuits whose resonant frequencies are slightly different can make the frequency band to be attenuated wider.

Figure 3:
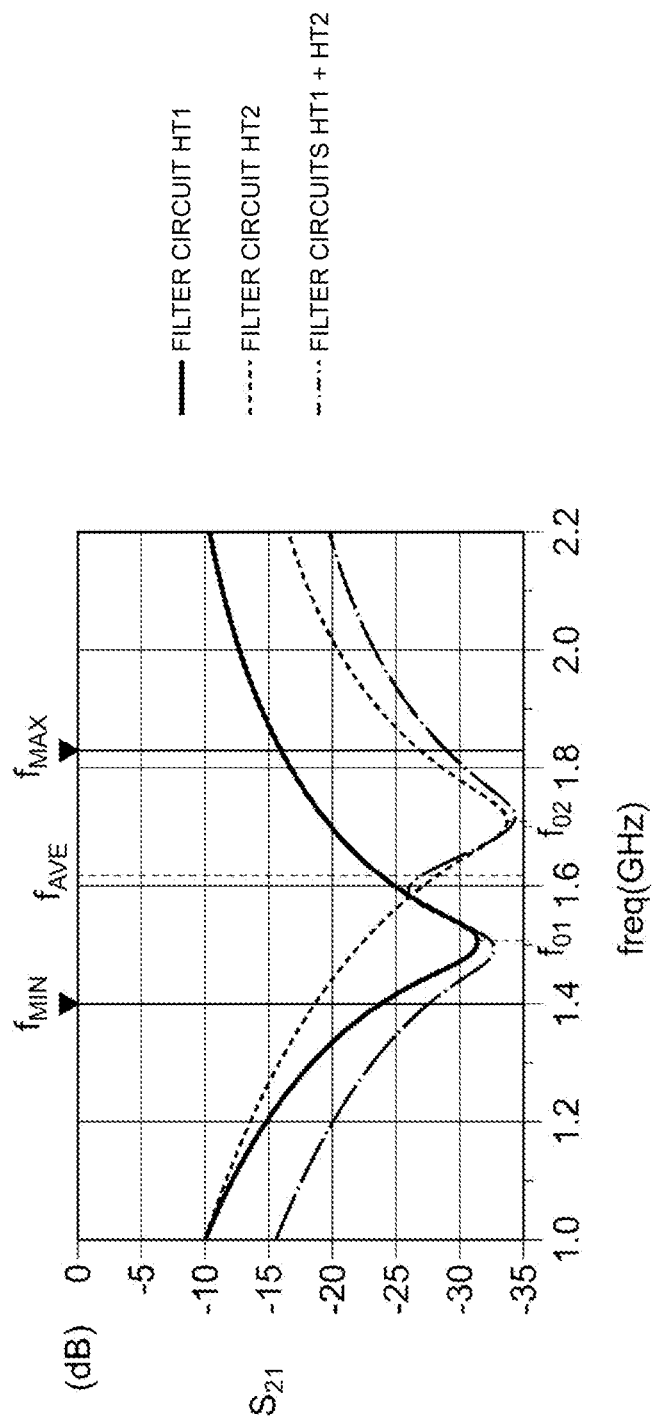
FIG. 3 is a diagram illustrating simulation results of the frequency characteristic of the filter circuits in example configuration C.

FIG. 3 is a diagram illustrating simulation results of a frequency characteristic of the filter circuits HT1 and HT2 in the example configuration C. Specifically, FIG. 3 illustrates simulation results of the S-parameter $S_{21}$ of the output of the transistor Q2 in a configuration including only the filter circuit HT1, a configuration including only the filter circuit HT2, and a configuration including both the filter circuits HT1 and HT2. In the graph illustrated in FIG. 3, the vertical axis represents the S-parameter $S_{21}$ (in dB), and the horizontal axis represents frequency (in GHz). In this embodiment, the lower limit (first frequency) $f_{MIN}$ of the second-order harmonic frequencies in the lowest frequency band (band 12) among the frequency bands of the transmission signal is 1.398 GHz, and the upper limit (second frequency) $f_{MAX}$ of the second-order harmonic frequencies in the highest frequency band (band 8) among the frequency bands of the transmission signal is 1.830 GHz. The average (center frequency) $f_{AVE}$ of the lower limit $f_{MIN}$ and the upper limit $f_{MAX}$ is thus 1.614 GHz. In this simulation, the filter circuits HT1 and HT2 are designed so that the resonant frequency $f_{01}$ of the filter circuit HT1 lies between the lower limit $f_{MIN}$ and the average $f_{AVE}$ ($f_{MIN} < f_{01} < f_{AVE}$) and the resonant frequency $f_{02}$ of the filter circuit HT2 lies between the average $f_{AVE}$ and the upper limit $f_{MAX}$ ($f_{AVE} < f_{02} < f_{MAX}$).

As illustrated in FIG. 3, a combination of the filter circuits HT1 and HT2 respectively having the resonant frequencies $f_{01}$ and $f_{02}$ that are different from each other achieves a frequency characteristic with two peaks of attenuation greater than others. This indicates that, in the example configuration C, the attenuations around the lower limit $f_{MIN}$ and the upper limit $f_{MAX}$ of the second-order harmonic frequency band are greater than those in the example configuration A or the example configuration B including two filter circuits whose resonant frequencies are equal.

In the example configuration C, the self-inductance values of the inductors L1 and L2 may be equal or different.

Figure 4:
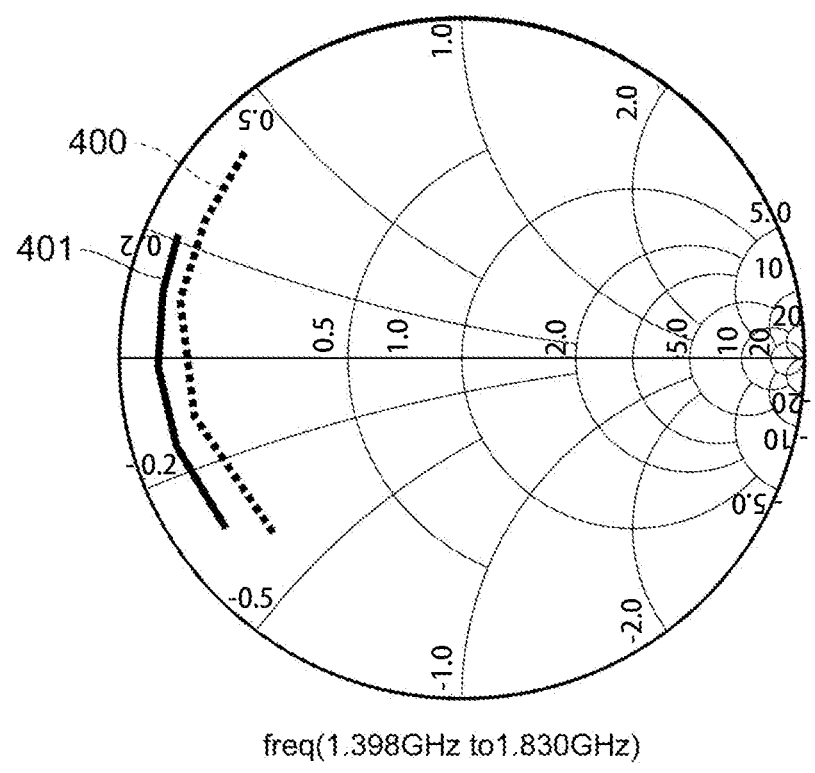
FIG. 4 is a Smith chart illustrating load-impedance loci for a collector of a transistor included in a power amplifier in the power stage in the example configuration B and a comparative example.

FIG. 4 is a Smith chart illustrating load-impedance loci for the collector of the transistor Q2 in the example configuration B and a comparative example. In the comparative example, a power amplifier circuit includes only one filter circuit that is similar to the filter circuit HT1. Referring to FIG. 4, a locus 400 is a locus in the comparative example, and a locus 401 is a locus in the example configuration B. Note that the signal frequency is changed within a range equal to the second-order harmonic frequency band (1.398 GHz to 1.830 GHz).

As illustrated in FIG. 4, compared with the locus 400 in the comparative example, the locus 401 in the example configuration B indicates that the impedance moves toward the short-circuit side (i.e., the circumferential side) over the entire second-order harmonic frequency band. This is because, as described above, since the two filter circuits HT1 and HT2 are connected in parallel, the resistance component is approximately halved and the real part of the impedance is decreased.

Figure 5:
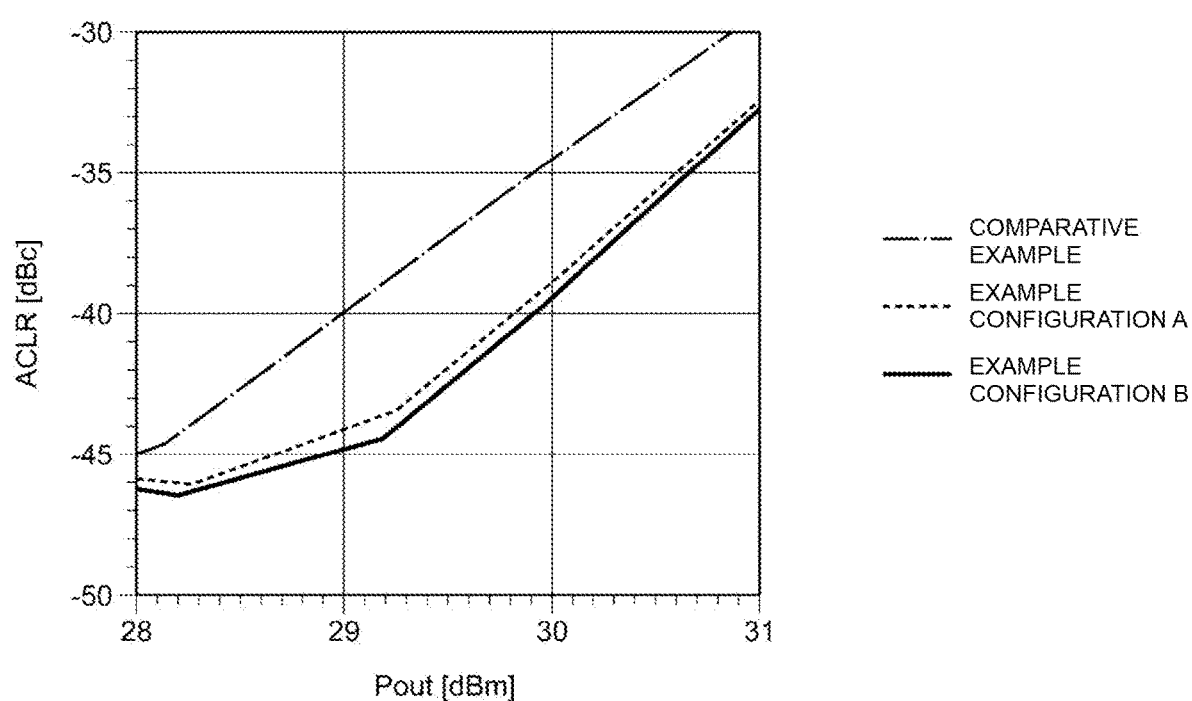
FIG. 5 is a graph depicting simulation results of the adjacent channel leakage ratio (ACLR) characteristic in example configuration A, the example configuration B, and the comparative example.

FIG. 5 is a graph depicting simulation results of the adjacent channel leakage ratio (ACLR) characteristic in the example configuration A, the example configuration B, and a comparative example. In the comparative example, a power amplifier circuit includes only one filter circuit that is similar to the filter circuit HT1. In the graph illustrated in FIG. 5, the vertical axis represents the ACLR characteristic (in dBc), and the horizontal axis represents the output power Pout (in dBm) of the transistor Q2.

As illustrated in FIG. 5, the ACLR characteristic is improved in the example configuration A or the example configuration B, compared with the comparative example. More specifically, for example, when the output power Pout is 29 dBm, the ACLR in the example configuration A is lower is than that in the comparative example by about 4 dB. In comparison between the example configuration A and the example configuration B, the ACLR in the example configuration B is further lower than that in the example configuration A by about 1 dB. That is, as indicated in FIG. 2 and FIG. 3, a configuration including the two filter circuits HT1 and HT2 attenuates the second-order harmonic over a wide range and reduces the distortion of the output signal accordingly.

Figure 6:
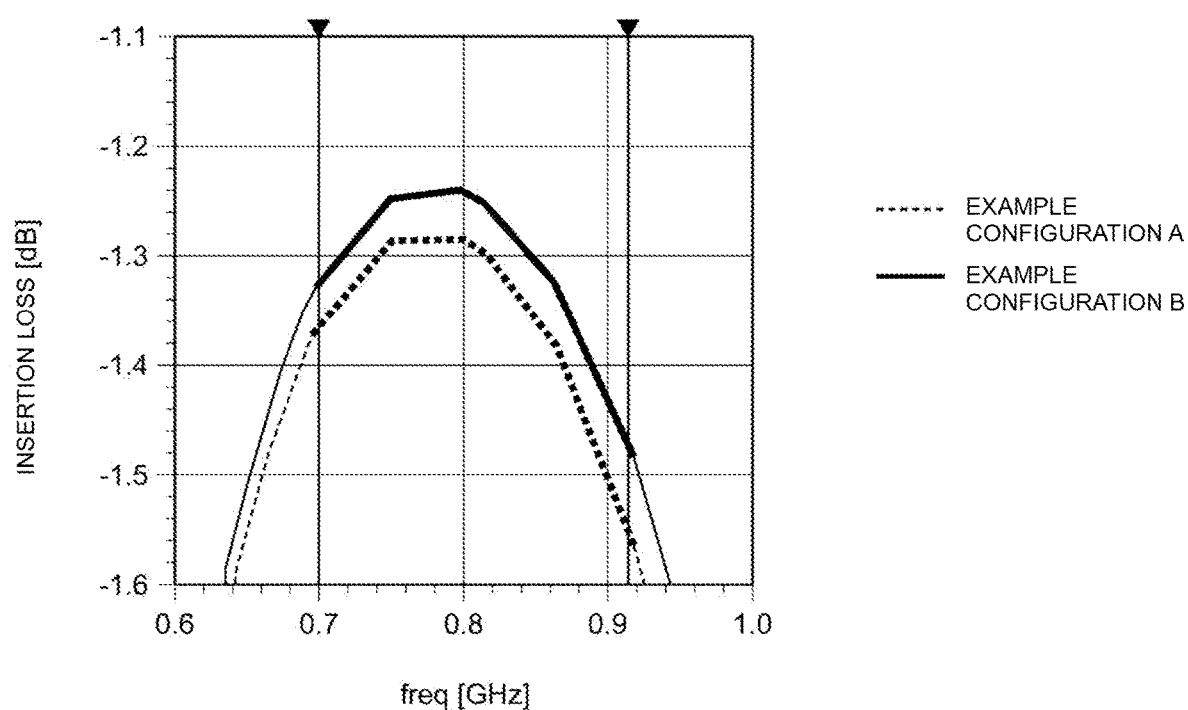
FIG. 6 is a diagram illustrating simulation results of the frequency characteristic around a fundamental frequency in the example configuration A and the example configuration B.

FIG. 6 is a diagram illustrating simulation results of a frequency characteristic around the fundamental frequency in the example configuration A and the example configuration B. Specifically, the graph illustrated in FIG. 6 depicts attenuations around a fundamental frequency in the example configuration A and the example configuration B in which the filter circuits HT1 and HT2 are combined. In the graph illustrated in FIG. 6, the vertical axis represents the S-parameter $S_{21}$ (in dB) (i.e., insertion loss), and the horizontal axis represents frequency (in GHz). In FIG. 6, the simulation results within a range corresponding to the frequency band (699 MHz to 915 MHz) of the transmission signal in the low band are indicated by bold lines. In the simulation, furthermore, insertion loss of the elements also including the matching network 12 illustrated in FIG. 1 is calculated.

As illustrated in FIG. 6, the example configuration B improves the insertion loss compared with the example configuration A. This is because the Q-value of one of the two filter circuits HT1 and HT2 is increased, thereby increasing the Q-value of a configuration including both the two filter circuits HT1 and HT2.

Figure 7:
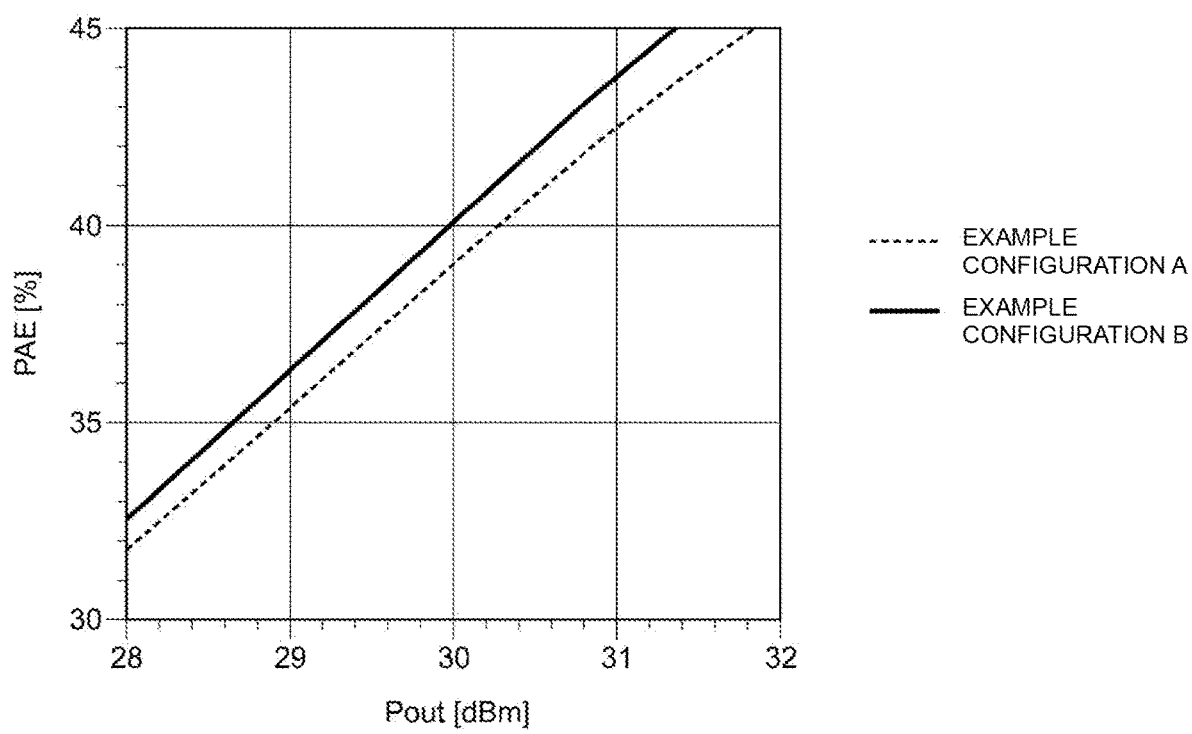
FIG. 7 is a graph depicting an example of simulation results of the power added efficiency in the example configuration A and the example configuration B.

FIG. 7 is a graph depicting an example of simulation results of the power added efficiency in the example configuration A and the example configuration B. In the graph illustrated in FIG. 7, the horizontal axis represents the output power Pout (in dBm), and the vertical axis represents the power added efficiency (PAE) (in %).

As illustrated in FIG. 7, the example configuration B achieves higher PAE than the example configuration A by about 1 to 2%. This is because, as illustrated in FIG. 6, in the example configuration B with high Q-value, the insertion loss is improved in the fundamental frequency range.

The results described above indicate that the power amplifier circuit 100A can attenuate the second-order harmonic over a wider range than a power amplifier circuit including only one filter circuit, regardless of which of the example configurations A to C is used. It is also indicated that the resistance component caused by the inductors L1 and L2 is approximately halved and thus the impedance of filter circuits at the second-order harmonic can further move toward the short-circuit side. Accordingly, the example configurations A to C can reduce the distortion of the output signal. Furthermore, compared with the example configuration A including two filter circuits whose characteristics are equal, the example configuration B can suppress or reduce the loss of the fundamental frequency while performing harmonic attenuation over a wide range. Thus, power added efficiency can be increased. Additionally, compared with the example configuration A or the example configuration B including two filter circuits whose resonant frequencies are equal, the example configuration C provides increased attenuations around the lower limit $f_{MIN}$ and the upper limit $f_{MAX}$ of the second-order harmonic frequency band.

FIG. 1 illustrates an example in which the filter circuits HT1 and HT2 are connected to a power amplifier in the power stage. However, the filter circuits HT1 and HT2 may not necessarily be connected to a power amplifier in the power stage. For example, a power amplifier in the drive stage may be provided with similar filter circuits.

Figure 8:
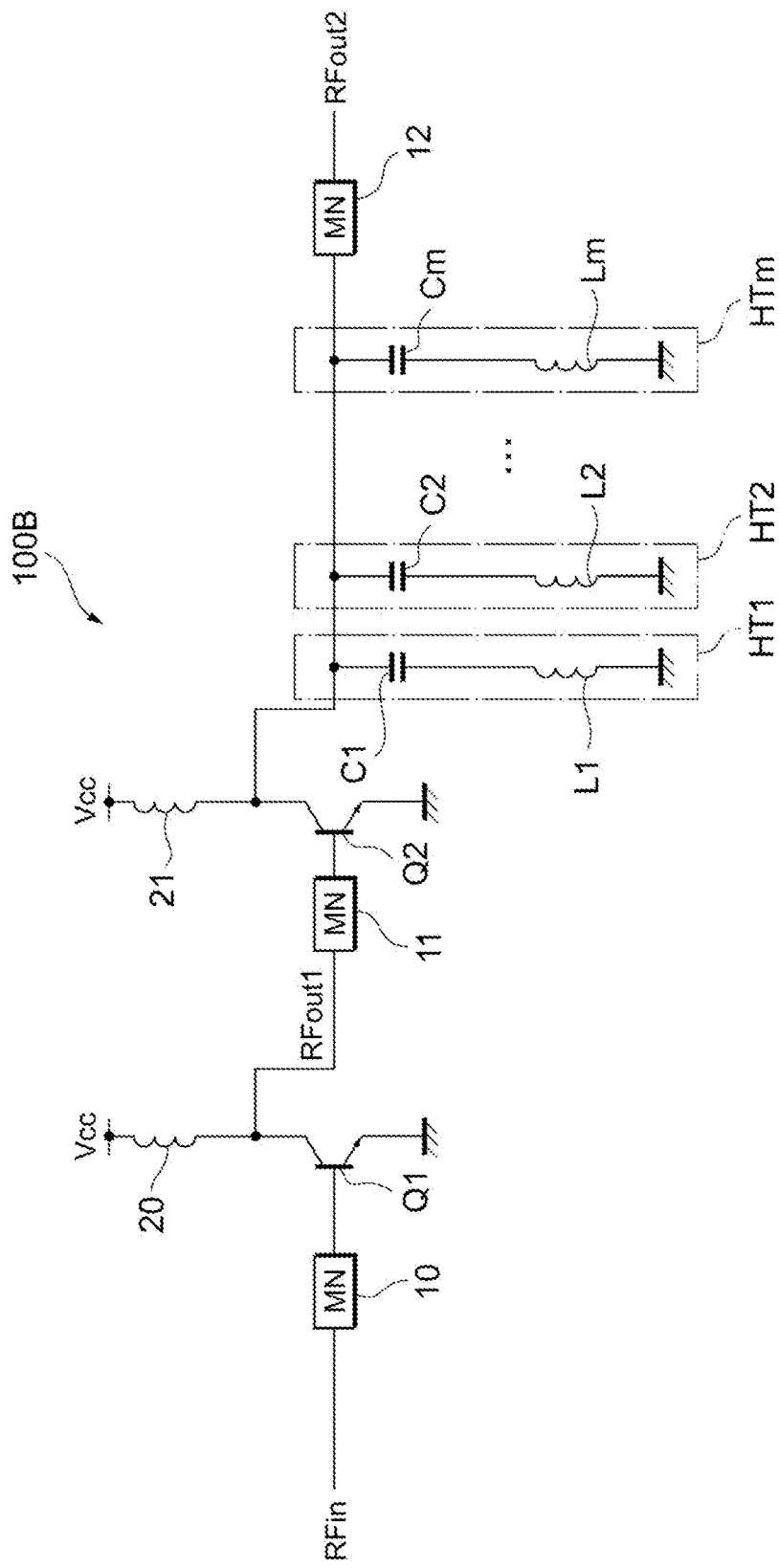
FIG. 8 is a circuit diagram of a power amplifier circuit according to a second embodiment of the present disclosure.

FIG. 8 is a circuit diagram of a power amplifier circuit 100B according to a second embodiment of the present disclosure. The same or substantially the same elements as those of the power amplifier circuit 100A illustrated in FIG. 1 are given the same numerals and will not be described repeatedly. In the second embodiment and the following embodiment, features common to the first embodiment will not be described repeatedly and only differences from the first embodiment will be described. In particular, similar operational effects achieved with similar configurations will not be described again in the individual embodiments.

Unlike the power amplifier circuit 100A, the power amplifier circuit 100B illustrated in FIG. 8 includes m filter circuits HT1 to HTm (where m is an integer greater than or equal to 3).

Like the filter circuits HT1 and HT2, the m filter circuits HT1 to HTm respectively include capacitors C1 to Cm and inductors L1 to Lm, each of the capacitors C1 to Cm and the corresponding one of the inductors L1 to Lm being connected in series between the collector of the transistor Q2 and ground. Further, each of the m filter circuits HT1 to HTm has a frequency characteristic that attenuates the Nth-order harmonic. In this manner, the number of filter circuits used to attenuate the Nth-order harmonic is not limited to two and may be three or more. As the number of filter circuits to be connected in parallel increases, the resistance component is further reduced. Thus, the impedance of the filter circuits HT1 to HTm can further move toward the short-circuit side. The frequency characteristics of the filter circuits HT1 to HTm are not limited to any specific characteristics. For example, any of the example configurations A to C described above may be applied to each of the m filter circuits HT1 to HTm.

Figure 9:
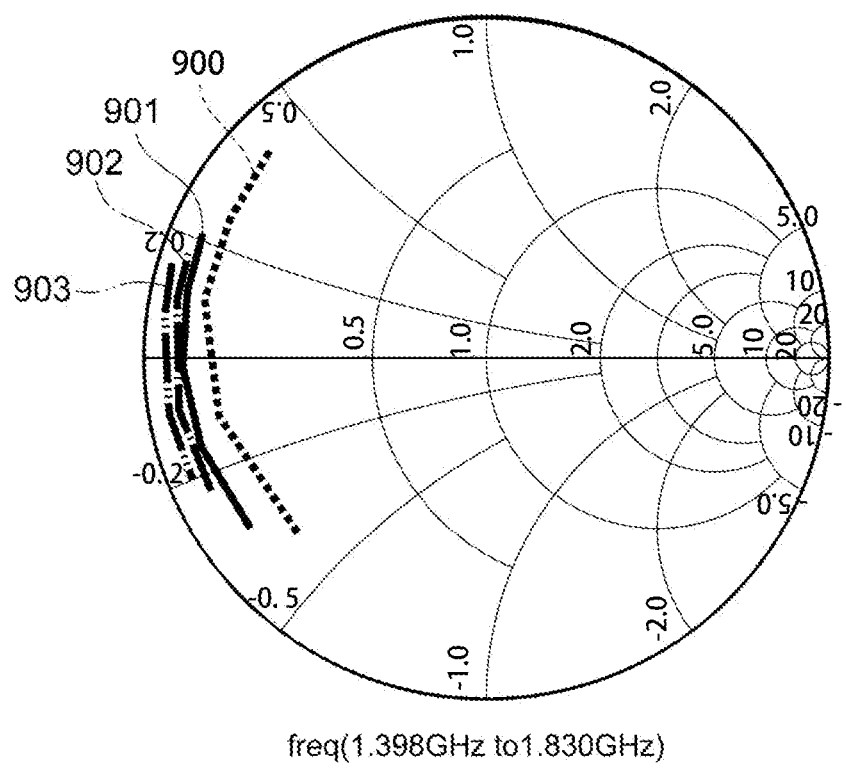
FIG. 9 is a Smith chart illustrating load-impedance loci for a collector of a transistor included in a power amplifier in the power stage in the power amplifier circuit according to the second embodiment of the present disclosure.

FIG. 9 is a Smith chart illustrating load-impedance loci for the collector of the transistor Q2 in the power amplifier circuit 100B. Specifically, in FIG. 9, loci 900 to 903 respectively indicate loci obtained with configurations including one through four filter circuits, each of which is similar to the filter circuit HT1. The signal frequency is changed within a range equal to the second-order harmonic frequency band (1.398 GHz to 1.830 GHz) of the transmission signal.

As illustrated in FIG. 9, as the number of filter circuits increases, the impedance moves more toward the short-circuit side (i.e., the circumferential side). The illustrated results also indicate that since a plurality of filter circuits are connected in parallel, the resistance component is reduced.

Figure 10:
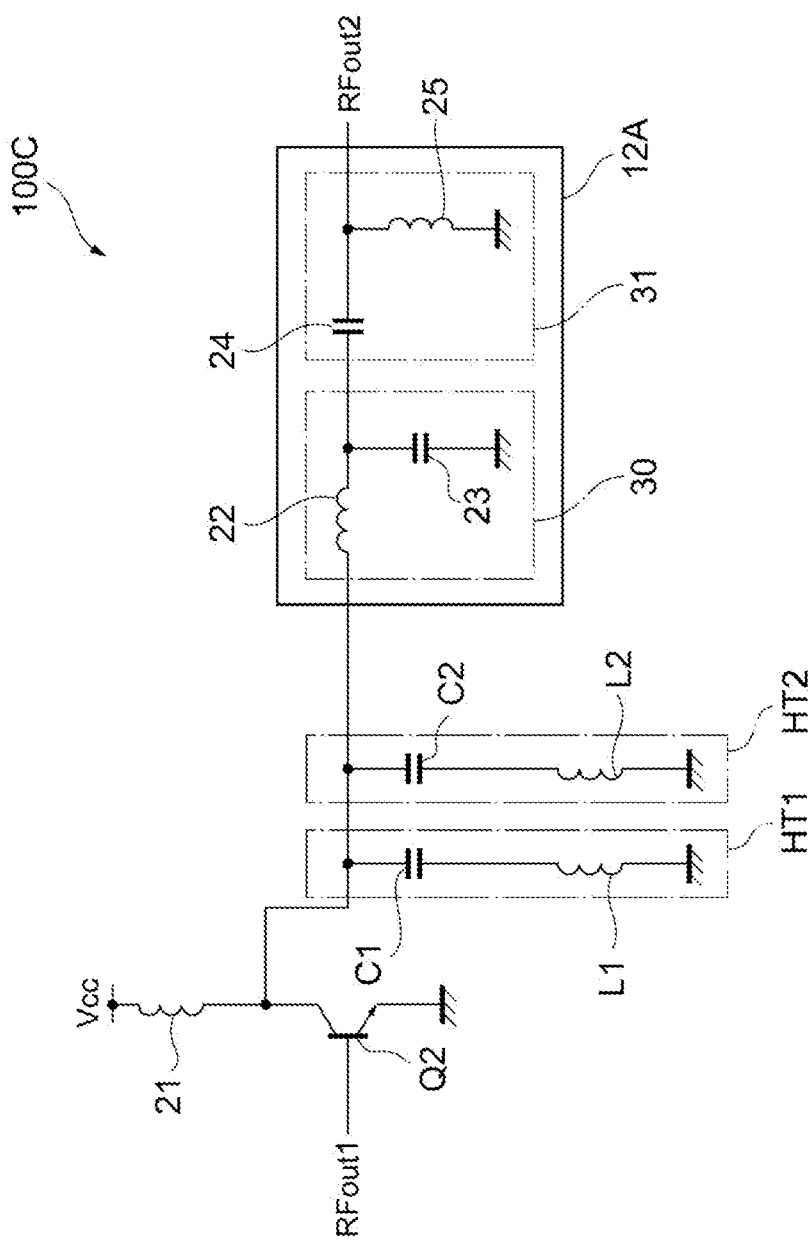
FIG. 10 is a circuit diagram of a power amplifier circuit according to a third embodiment of the present disclosure.

FIG. 10 is a circuit diagram of a power amplifier circuit 100C according to a third embodiment of the present disclosure. The same or substantially the same elements as those of the power amplifier circuit 100A illustrated in FIG. 1 are given the same numerals and will not be described repeatedly. FIG. 10 illustrates only the constituent elements subsequent to the transistor Q2 but does not illustrate the preceding constituent elements.

In the power amplifier circuit 100C illustrated in FIG. 10, a specific configuration of the matching network 12 included in the power amplifier circuit 100A illustrated in FIG. 1 is illustrated. Specifically, a matching network 12A includes, for example, a low pass filter circuit 30 and a high pass filter circuit 31.

The low pass filter circuit 30 includes an inductor 22 and a capacitor 23. The inductor 22 is connected in series with a signal line that is connected to the collector of the transistor Q2 and that transmits the amplified signal RFout2. The capacitor 23 is connected between an end on an output side of the inductor 22 and ground. The low pass filter circuit 30 has a frequency characteristic that attenuates harmonic components included in the amplified signal RFout2 and that allows the fundamental frequency component to pass therethrough.

The high pass filter circuit 31 includes a capacitor 24 and an inductor 25. The capacitor 24 is connected in series with the signal line that is connected to the collector of the transistor Q2 and that transmits the amplified signal RFout2. The inductor 25 is connected between an end on an output side of the capacitor 24 and ground. The high pass filter circuit 31 has a frequency characteristic that allows the fundamental frequency component and harmonic components included in the amplified signal RFout2 to pass therethrough.

As illustrated in FIG. 10, when the matching network 12A includes the high pass filter circuit 31, the harmonic components pass through the high pass filter circuit 31. Thus, the harmonic components may be insufficiently attenuated. The application of the two filter circuits HT1 and HT2 to this configuration enhances the effect of attenuating harmonics over a wide range.

The matching network 12A may have any other configuration. For example, the matching network 12A may include a combination of two low pass filter circuits 30 instead of a combination of the low pass filter circuit 30 and the high pass filter circuit 31.

Figure 11:
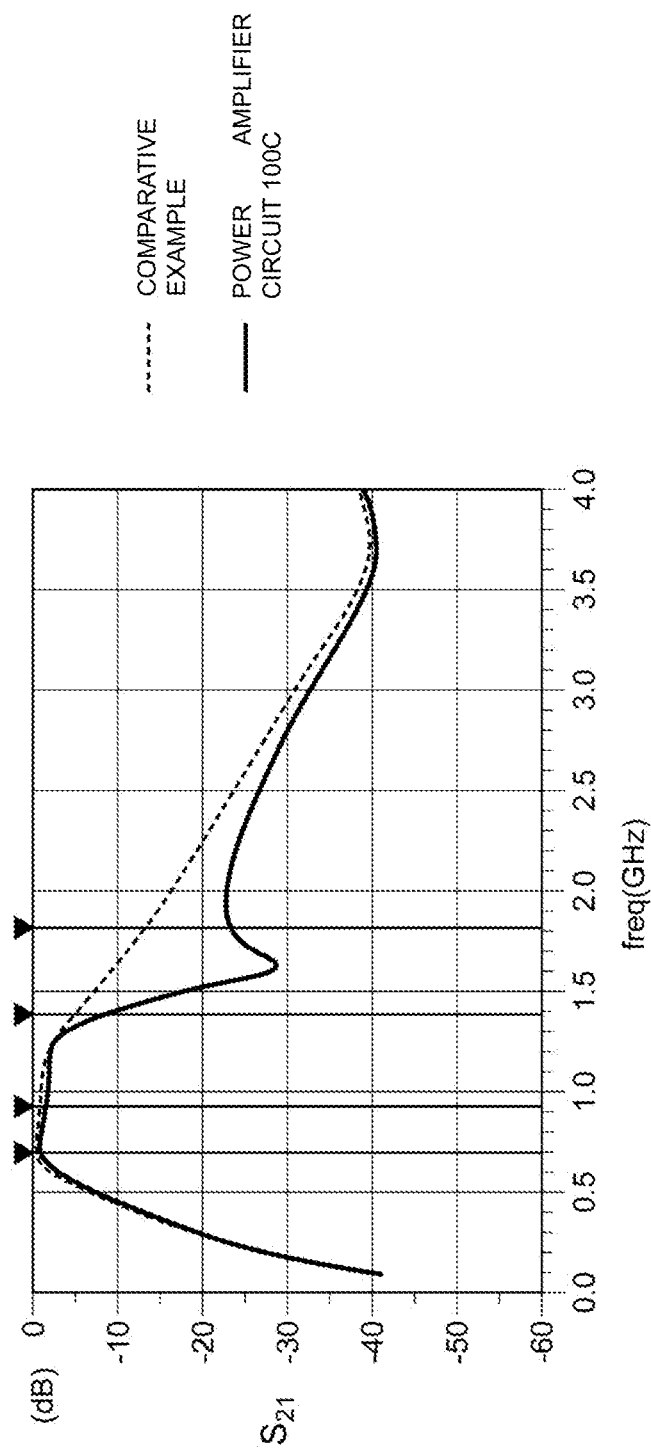
FIG. 11 is a diagram illustrating simulation results of the frequency characteristic in the power amplifier circuit according to the third embodiment of the present disclosure and in a comparative example.

FIG. 11 is a diagram illustrating simulation results of the frequency characteristic in the power amplifier circuit 100C and in a comparative example. In the comparative example in this simulation, a power amplifier circuit does not include a circuit similar to the filter circuit HT1. In the graph illustrated in FIG. 11, the vertical axis represents the S-parameter $S_{21}$ (in dB), and the horizontal axis represents frequency (in GHz).

As illustrated in FIG. 11, the power amplifier circuit 100C, which includes the filter circuits HT1 and HT2, greatly attenuates the second-order harmonic substantially without necessarily causing loss of the fundamental frequency.

Figure 12:
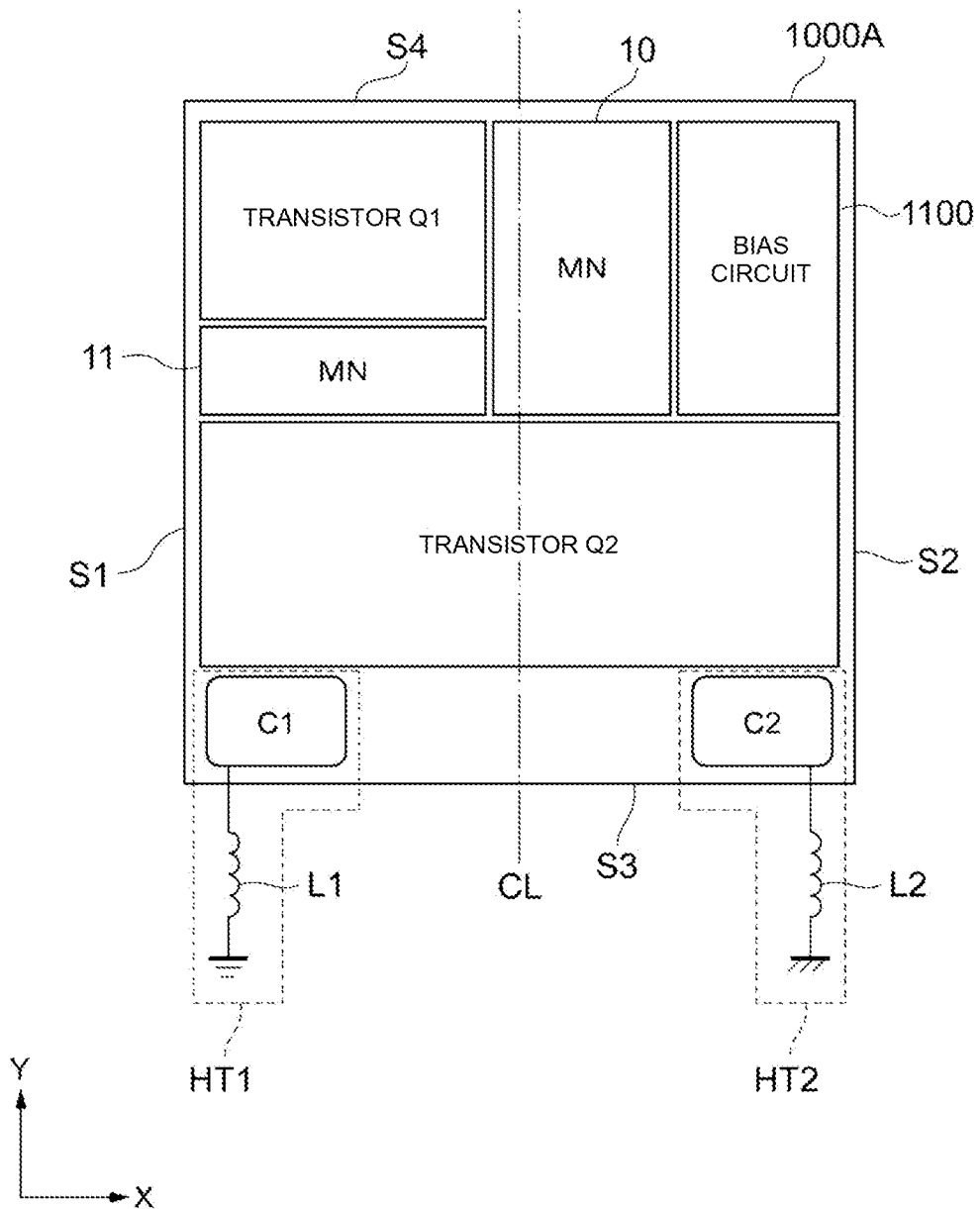
FIG. 12 is a diagram illustrating an example arrangement of constituent elements on a semiconductor chip having the power amplifier circuit according to the first embodiment of the present disclosure.

FIG. 12 is a diagram illustrating an example arrangement of constituent elements on a semiconductor chip having the power amplifier circuit 100A according to the first embodiment of the present disclosure. Among the constituent elements illustrated in FIG. 12, constituent elements corresponding to those included in the power amplifier circuit 100A illustrated in FIG. 1 are given numerals or symbols similar to those illustrated in FIG. 1, for convenience of description.

A semiconductor chip 1000A illustrated in FIG. 12 has, for example, the transistors Q1 and Q2, the matching networks 10 and 11, a bias circuit 1100, and the capacitors C1 and C2.

The semiconductor chip 1000A is a chip having a principal surface having a substantially rectangular shape substantially parallel to a plane defined by an X axis and a Y axis. The X axis and the Y axis cross each other (in FIG. 12, the X axis and the Y axis are perpendicular to each other). The principal surface has a side S1 (first side), a side S2 (second side), a side S3, and a side S4. The sides S1 and S2 are substantially parallel to the Y axis (first direction), and the sides S3 and S4 are substantially parallel to the X axis (second direction). The semiconductor chip 1000A has HBTs, other elements, and so on and is mounted on a module substrate (not illustrated), for example.

The transistors Q1 and Q2 are each configured such that, for example, a plurality of fingers, each of which is the minimum unit constituting a transistor, are connected in parallel and are aligned with each other.

The bias circuit 1100, which is not illustrated in FIG. 1, is a circuit that supplies a bias current or voltage to the respective bases of the transistors Q1 and Q2.

The capacitors C1 and C2, which are respectively included in the filter circuits HT1 and HT2, are each constituted by, for example, an on-chip capacitor directly formed on the semiconductor chip 1000A. The capacitors C1 and C2 are arranged substantially symmetrically in the X-axis direction of the semiconductor chip 1000A with respect to a center line CL extending in the Y-axis direction of the semiconductor chip 1000A in plan view of the principal surface of the semiconductor chip 1000A. In this embodiment, the capacitor C1 is arranged adjacent to the side S1 on the negative X-axis direction side, and the capacitor C2 is arranged adjacent to the side S2 on the positive X-axis direction side. Further, the capacitors C1 and C2 are arranged adjacent to the side S3, which is substantially parallel to the X axis. In this manner, the capacitors C1 and C2 are arranged substantially symmetrically with respect to the center line CL, thereby preventing or reducing concentration of heat on fingers near the capacitors C1 and C2 among the plurality of fingers included in the transistor Q2. Thus, the transistor Q2 is prevented from being broken.

In this embodiment, furthermore, the inductors L1 and L2, which are respectively included in the filter circuits HT1 and HT2, are each constituted by, for example, a bond wire over which the semiconductor chip 1000A is mounted on the module substrate (not illustrated). For example, the respective bond wires constituting the inductors L1 and L2 are led outside the semiconductor chip 1000A from the capacitors C1 and C2, respectively, so as to extend substantially in parallel to the Y axis. As illustrated in FIG. 12, the capacitors C1 and C2 are arranged at both ends with the center line CL therebetween, thus ensuring a distance between the inductor L1 and the inductor L2. This can prevent or reduce variations in inductance due to coupling between the inductor L1 and the inductor L2. The bond wires may be led so as to, for example, be substantially parallel to the X axis instead of being substantially parallel to the Y axis.

The other end of the inductor L1 and the other end of the inductor L2 are each supplied with a ground potential. The ground potential supplied to the other end of the inductor L1 and the ground potential supplied to the other end of the inductor L2 may be fed through different electrodes. For example, the other end of the inductor L1 and the other end of the inductor L2 may be electrically connected to different ground electrodes disposed on the bottom layer of the module substrate on which the semiconductor chip 1000A is mounted. This configuration can eliminate or reduce the effect of a parasitic component from the other constituent elements. In FIG. 12, the ground potentials of the filter circuits HT1 and HT2 are identified with different signs, which schematically indicate that the ground potentials are supplied through different electrodes.

Figure 13:
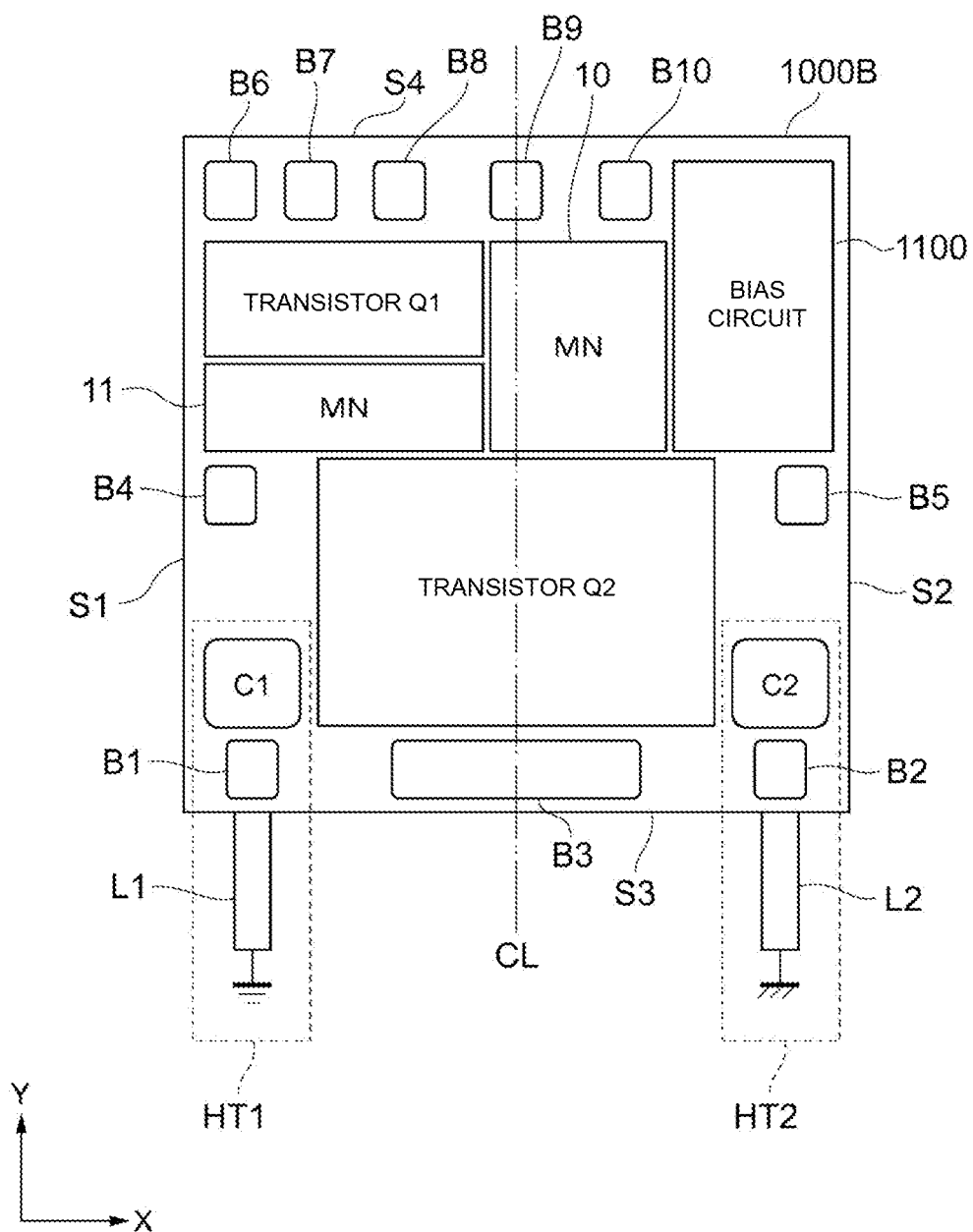
FIG. 13 is a diagram illustrating another example arrangement of constituent elements on the semiconductor chip having the power amplifier circuit according to the first embodiment of the present disclosure.

FIG. 13 is a diagram illustrating another example arrangement of constituent elements on the semiconductor chip having the power amplifier circuit 100A according to the first embodiment of the present disclosure. FIG. 13 illustrates an example configuration in which a semiconductor chip 1000B illustrated in FIG. 13 is mounted on a module substrate (not illustrated) by using a bump structure instead of using bond wires. More specifically, unlike the semiconductor chip 1000A illustrated in FIG. 12, the semiconductor chip 1000B further includes bumps B1 to B10.

The bumps B1 and B2 are bumps that electrically connect the capacitors C1 and C2 to components outside the semiconductor chip 1000B, respectively. Specifically, the bump B1 is arranged adjacent to the capacitor C1 at a corner of the semiconductor chip 1000B. The capacitor C1 is electrically connected to the inductor L1, which is disposed on the module substrate, via the bump B1. The bump B2 is arranged adjacent to the capacitor C2 at another corner of the semiconductor chip 1000B. The capacitor C2 is electrically connected to the inductor L2, which is disposed on the module substrate, via the bump B2.

The bump B3 is arranged between the transistor Q2 and the side S3. For example, the bump B3 is a bump to which the collectors of the fingers included in the transistor Q2 are connected. Thus, the amplified signal RFout2 is output from the bump B3. Each of the bumps B4 to B10 functions as, for example, but not limited to, a terminal for supplying a power supply voltage, an input signal, a ground potential, or the like.

The inductors L1 and L2 are constituted by, for example, wiring or surface mount devices (SMDs) disposed on the module substrate (not illustrated). As in the semiconductor chip 1000A, the ground potential supplied to the other end of the inductor L1 and the ground potential supplied to the other end of the inductor L2 may be fed through different electrodes.

Also, in the semiconductor chip 1000B, the filter circuits HT1 and HT2 are arranged substantially symmetrically with respect to the center line CL in a manner similar to that in the semiconductor chip 1000A. Thus, the plurality of fingers included in the transistor Q2 are uniformly affected by heat.

Each of the bumps B1 to B10 may be, for example, but not limited to, a Cu pillar bump or a solder bump.

The arrangement of the transistors Q1 and Q2, the bias circuit 1100, and the matching networks 10 and 11 on the semiconductor chips 1000A and 1000B is an example and is not construed as a limitation.

With regard to the semiconductor chips 1000A and 1000B, the ground potential supplied to the other end of the inductor L1 and the ground potential supplied to the other end of the inductor L2 may be fed through the same electrode.

The foregoing has described some exemplary embodiments of the present disclosure. The power amplifier circuits 100A to 100C include the transistor Q2 that amplifies an input signal (the amplified signal RFout1) and outputs the amplified signal RFout2, and the filter circuits HT1 and HT2 having a frequency characteristic that attenuates the Nth-order harmonic of the amplified signal RFout2 (where N is an integer greater than or equal to 2). The filter circuit HT1 includes the capacitor C1 and the inductor L1, which are connected in series between the collector of the transistor Q2 and ground, and the filter circuit HT2 includes the capacitor C2 and the inductor L2, which are connected in series between the collector of the transistor Q2 and ground. This configuration can attenuate the Nth-order harmonic over a wider range than a configuration including only one similar filter circuit. Furthermore, since the filter circuits HT1 and HT2 are connected in parallel, the resistance component is approximately halved. Thus, the impedance of the filter circuits HT1 and HT2 can move toward the short-circuit side, and the distortion of the output signal can be reduced.

In the power amplifier circuits 100A to 100C, furthermore, the self-inductance value of the inductor L1 may be larger than the self-inductance value of the inductor L2. This configuration can suppress or reduce the loss of the fundamental frequency while performing harmonic attenuation over a wide range, compared with a configuration including two filter circuits whose characteristics are equal. Thus, power added efficiency can be increased.

In the power amplifier circuits 100A to 100C, furthermore, the filter circuit HT1 and the filter circuit HT2 may have different resonant frequencies. In particular, the resonant frequency $f_{o1}$ of the filter circuit HT1 may lie between the lower limit $f_{MIN}$ and the average $f_{AVE}$ of the Nth-order harmonic frequency band, and the resonant frequency $f_{o2}$ of the filter circuit HT2 may lie between the average $f_{AVE}$ and the upper limit $f_{MAX}$ of the Nth-order harmonic frequency band. This configuration increases attenuations around the lower limit $f_{MIN}$ and the upper limit $f_{MAX}$, compared with a configuration including two filter circuits whose resonant frequencies are equal.

Alternatively, in the power amplifier circuits 100A to 100C, the filter circuit HT1 and the filter circuit HT2 have an equal resonant frequency.

The power amplifier circuit 100C further includes the high pass filter circuit 31. The use of the filter circuits HT1 and HT2 in a configuration that can insufficiently attenuate harmonic components enhances the effect of attenuating harmonics over a wide range.

Furthermore, in plan view of the principal surfaces of the semiconductor chips 1000A and 1000B having the power amplifier circuits 100A to 100C, the capacitors C1 and C2 are arranged substantially symmetrically in the X-axis direction with respect to the center line CL. This configuration prevents or reduces concentration of heat on fingers near the capacitors C1 and C2 among the plurality of fingers included in the transistor Q2 and prevents the transistor Q2 from being broken.

In plan view of the principal surfaces of the semiconductor chips 1000A and 1000B having the power amplifier circuits 100A to 100C, furthermore, the capacitors C1 and C2 are respectively arranged adjacent to the opposing sides S1 and S2 of the semiconductor chips 1000A and 1000B. This configuration ensures a distance between the inductor L1 and the inductor L2. Thus, variations in inductance due to coupling between the inductor L1 and the inductor L2 can be prevented or reduced.

In the power amplifier circuits 100A to 100C, furthermore, an end of the inductor L1 of the filter circuit HT1 and an end of the inductor L2 of the filter circuit HT2 may be supplied with ground potentials through different electrodes. This configuration can eliminate or reduce the effect of a parasitic component from other constituent elements.

The embodiments described above are intended to help easily understand the present disclosure and are not to be used to construe the present disclosure in a limiting fashion. The present disclosure may be modified or improved without departing from the gist thereof, and equivalents of such modifications or improvements are also included in the present disclosure. That is, the embodiments may be appropriately modified in design by those skilled in the art, and such modifications also fall within the scope of the present disclosure so long as the modifications include the features of the present disclosure. For example, elements included in the embodiments and the arrangements, materials, conditions, shapes, sizes, and so on thereof are not limited to those illustrated exemplarily but can be modified as appropriate. Elements included in the embodiments can be combined as much as technically possible, and such combinations of elements also fall within the scope of the present disclosure so long as the combinations of elements include the features of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
   a power amplifier configured to amplify an input signal and output an amplified signal from an output terminal;
   a first filter circuit configured to attenuate an Nth-order harmonic of the amplified signal, N being an integer greater than or equal to two;
   a second filter circuit configured to attenuate the Nth-order harmonic of the amplified signal; and
   a chip having a principal surface in a plane defined by a first direction and a second direction, the first direction and the second direction being orthogonal,
   wherein the first filter circuit comprises a first capacitor and a first inductor connected in series between the output terminal and ground,
   wherein the second filter circuit comprises a second capacitor and a second inductor connected in series between the output terminal and ground,
   wherein the first inductor and the second inductor each comprise one of a bond wire or a wiring on a module substrate,
   wherein the principal surface of the chip has a substantially rectangular shape having a first side and a second side, the first side and the second side being substantially parallel to the first direction, and wherein the first capacitor is arranged adjacent to the first side and the second capacitor is arranged adjacent to the second side.

2. A power amplifier circuit comprising:
a power amplifier configured to amplify an input signal and output an amplified signal from an output terminal;
a first filter circuit configured to attenuate an Nth-order harmonic of the amplified signal, N being an integer greater than or equal to two; and
a second filter circuit configured to attenuate the Nth-order harmonic of the amplified signal,
wherein the first filter circuit comprises a first capacitor and a first inductor connected in series between the output terminal and ground,
wherein the second filter circuit comprises a second capacitor and a second inductor connected in series between the output terminal and ground, and
wherein the first inductor has a larger self-inductance value than the second inductor, and
wherein the first inductor and the second inductor each comprise one of a bond wire or a wiring on a module substrate, and
wherein the first filter circuit has a resonant frequency substantially equal to a resonant frequency of the second filter circuit.

3. The power amplifier circuit according to claim 1, wherein the first filter circuit has a resonant frequency different from a resonant frequency of the second filter circuit.

4. A power amplifier circuit comprising:
a power amplifier configured to amplify an input signal and output an amplified signal from an output terminal;
a first filter circuit configured to attenuate an Nth-order harmonic of the amplified signal, N being an integer greater than or equal to two; and
a second filter circuit configured to attenuate the Nth-order harmonic of the amplified signal,
wherein the first filter circuit comprises a first capacitor and a first inductor connected in series between the output terminal and ground,
wherein the second filter circuit comprises a second capacitor and a second inductor connected in series between the output terminal and ground,
wherein the first inductor and the second inductor each comprise a bond wire or a wiring on a module substrate, and
wherein the first filter circuit has a resonant frequency substantially equal to a resonant frequency of the second filter circuit.

5. The power amplifier circuit according to claim 1, further comprising a high pass filter circuit subsequent to the output terminal.

6. The power amplifier circuit according to claim 1, wherein:
the input signal is a transmission signal in one of a plurality of frequency bands,
the resonant frequency of the first filter circuit is between a first frequency and a center frequency,
the resonant frequency of the second filter circuit is between the center frequency and a second frequency,
the first frequency is a lower-limit frequency of the Nth-order harmonic that corresponds to a lowest frequency band among the plurality of frequency bands,
the second frequency is an upper-limit frequency of the Nth-order harmonic that corresponds to a highest frequency band among the plurality of frequency bands, and
the center frequency is an average value of the first frequency and the second frequency.

7. The power amplifier circuit according to claim 1, wherein the first filter circuit is connected to ground via a first electrode and the second filter circuit is connected to ground via a second electrode, wherein the first and second electrodes are different.

8. The power amplifier circuit according to claim 7, wherein the first inductor is connected between the first electrode and ground, and the second inductor is connected between the second electrode and ground.

9. The power amplifier circuit according to claim 1, wherein the first inductor and the second inductor are both configured as bond wires over which the chip is mounted.

10. The power amplifier circuit according to claim 1, wherein the first inductor and the second inductor are external to the chip and are configured as surface mounted devices.

11. The power amplifier circuit according to claim 2, further comprising a high pass filter circuit subsequent to the output terminal.

12. The power amplifier circuit according to claim 3, further comprising a high pass filter circuit subsequent to the output terminal.

13. The power amplifier circuit according to claim 2, further comprising:
a chip having a principal surface in a plane defined by a first direction and a second direction, the first direction and the second direction being orthogonal.

14. The power amplifier circuit according to claim 4, further comprising:
a chip having a principal surface in a plane defined by a first direction and a second direction, the first direction and the second direction being orthogonal.

15. The power amplifier circuit according to claim 2, wherein the first filter circuit is connected to ground via a first electrode and the second filter circuit is connected to ground via a second electrode, wherein the first and second electrodes are different.

16. The power amplifier circuit according to claim 3, wherein the first filter circuit is connected to ground via a first electrode and the second filter circuit is connected to ground via a second electrode, wherein the first and second electrodes are different.

17. The power amplifier circuit according to claim 4, wherein the first filter circuit is connected to ground via a first electrode and the second filter circuit is connected to ground via a second electrode, wherein the first and second electrodes are different.

* * * * *